(12) United States Patent
Ohta et al.

(10) Patent No.: US 7,770,284 B2
(45) Date of Patent: Aug. 10, 2010

(54) MANUFACTURING METHOD OF MAGNETORESISTIVE EFFECT ELEMENT

(75) Inventors: Naoki Ohta, Chuo-ku (JP); Takeo Kagami, Chuo-ku (JP)

(73) Assignee: TDK Corporation, Tokyo (JP)

( * ) Notice: Subject to any disclaimer, the term of this patent is extended or adjusted under 35 U.S.C. 154(b) by 669 days.

(21) Appl. No.: 11/806,224

(22) Filed: May 30, 2007

(65) Prior Publication Data

US 2007/0279801 A1 Dec. 6, 2007

(30) Foreign Application Priority Data

Jun. 1, 2006 (JP) ............................. 2006-153489

(51) Int. Cl.
*G11B 5/127* (2006.01)
*H04R 31/00* (2006.01)

(52) U.S. Cl. .............. 29/603.16; 29/603.13; 29/603.14; 29/603.15; 29/603.18; 204/192.34; 216/62; 216/65; 216/66; 360/324.11; 360/324.12; 451/5; 451/41

(58) Field of Classification Search .............. 29/603.07, 29/603.13–603.16, 603.18; 204/192.34; 216/62, 65, 66; 360/324.11, 324.12; 428/692, 428/694; 451/5, 41
See application file for complete search history.

(56) References Cited

U.S. PATENT DOCUMENTS 6,621,667 B1 * 9/2003 He et al. ................ 360/324.12
6,669,983 B2 12/2003 Kagami et al.

FOREIGN PATENT DOCUMENTS

JP 2002-289944 10/2002
JP 2004-253593 9/2004

* cited by examiner

*Primary Examiner*—Paul D Kim
(74) *Attorney, Agent, or Firm*—Frommer Lawrence & Haug, LLP

(57) ABSTRACT

A manufacturing method of an MR element in which current flows in a direction perpendicular to layer planes, includes forming on a lower electrode layer an MR multi-layered film having a cap layer at a top thereof, forming a mask on the cap layer of the MR multi-layered film, patterning the MR multi-layered film by milling through the mask to form an MR multi-layered structure, forming a magnetic domain control bias layer by using a lift off method using the mask, after forming the magnetic domain control bias layer, forming an additional cap layer on the cap layer and a part of the magnetic domain control bias layer, planarizing a top surface of the additional cap layer and the magnetic domain control bias layer, and forming an upper electrode layer on the planarized top surface.

10 Claims, 5 Drawing Sheets

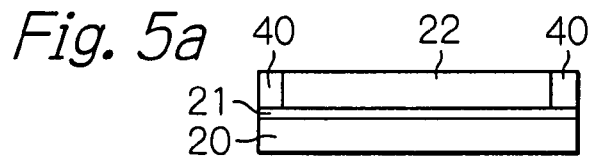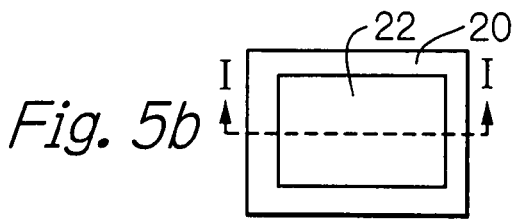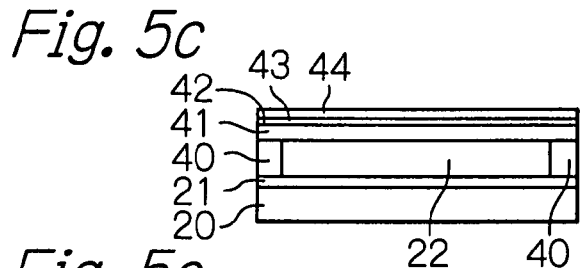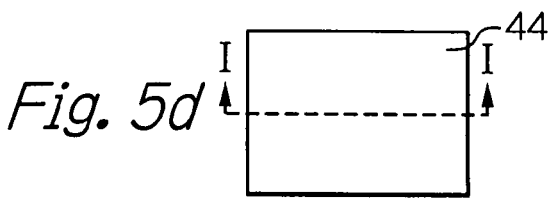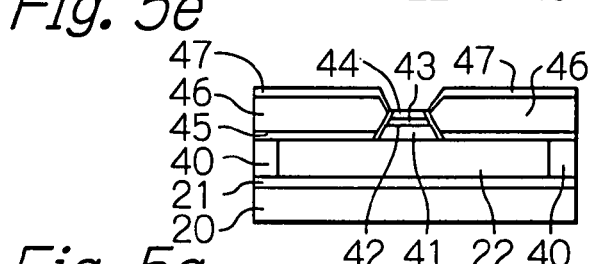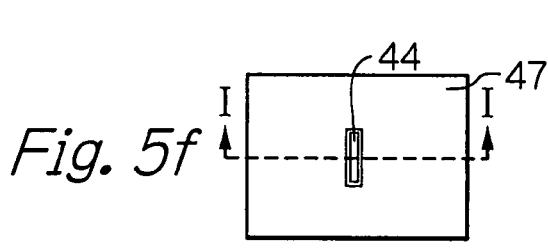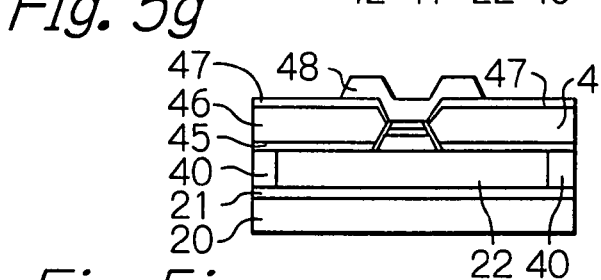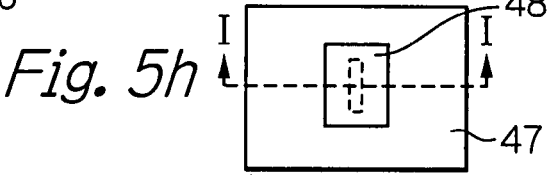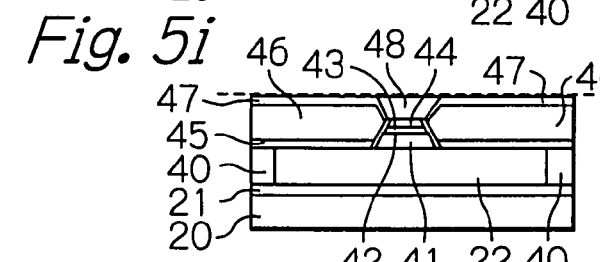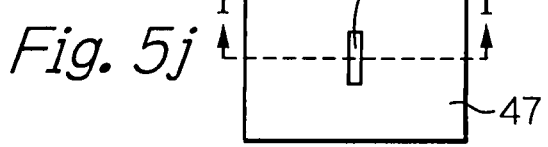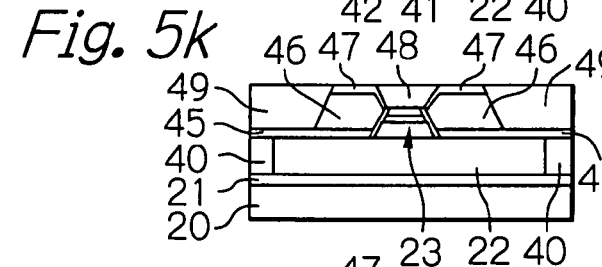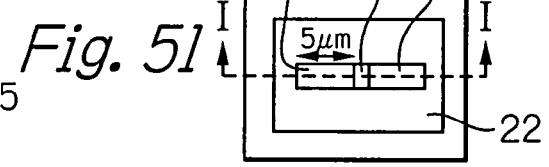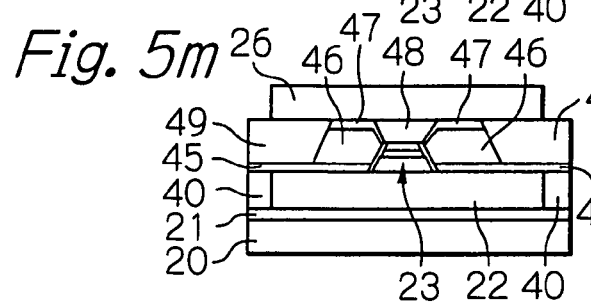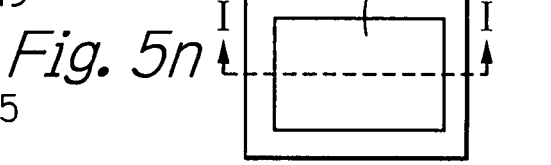

MANUFACTURING METHOD OF MAGNETORESISTIVE EFFECT ELEMENT

PRIORITY CLAIM

This application claims priority from Japanese patent application No. 2006-153489, filed on Jun. 1, 2006, which is incorporated herein by reference.

BACKGROUND OF THE INVENTION

1. Field of the Invention

The present invention relates to a method for manufacturing a magnetoresistive effect (MR) element, to a method for manufacturing a thin-film magnetic head with an MR element, and to a thin-film magnetic head with an MR element.

2. Description of the Related Art

As hard disk drive apparatuses (HDD) increase in capacity and reduce in size, highly sensitive and high-output thin-film magnetic heads are being demanded. In order to satisfy the demand, performance of giant magnetoresistive effect (GMR) thin-film magnetic heads with GMR read head elements are being improved. On the other hand, tunnel magnetoresistive effect (TMR) thin-film magnetic heads with TMR read head elements having a magnetoresistivity ratio more than twice as high as that of the GMR thin-film magnetic heads are being developed.

TMR thin-film heads differ from conventional GMR thin-film magnetic head in head structure because of the difference in the flowing direction of sense current. The head structure in which sense current flows in a direction parallel to the layer planes or film planes as in typical GMR thin-film heads is called as CIP (Current In Plane) structure, whereas the structure in which sense current flows in a direction perpendicular to the film planes as in TMR thin-film magnetic heads is called as CPP (Current Perpendicular to Plane) structure, respectively.

In fabrication of a GMR thin-film magnetic head with the CPP structure or a TMR thin-film magnetic head, it is important to ensure the flatness of a lower shield layer or lower electrode layer and an upper shield layer or upper electrode layer in order to improve the stability of the MR element.

The applicants of this application have proposed a method for manufacturing a thin-film magnetic head, having a step of depositing an MR multi-layer, a step of patterning the deposited MR multi-layer by milling with a mask to form an MR multi-layered structure, a step of depositing an insulation layer on a cap layer and a lower electrode layer at the top of the formed MR multi-layered structure, a step of planarizing the deposited insulation layer until the cap layer of the MR multi-layered structure is exposed, and a step of forming an upper electrode layer on the planarized insulation layer and MR multi-layered structure (U.S. Pat. No. 6,669,983 B2).

The manufacturing method described in U.S. Pat. No. 6,669,983 B2 is advantageous in that the upper electrode layer can be planarized. However, in general, it is necessary that the cap layer of the MR multi-layered structure is considerably thick because this layer is planarized by milling or chemical-mechanical polishing (CMP).

If the cap layer is thick, the profile of the MR multi-layered structure (cross section parallel to the air bearing surface (ABS)) will be trapezoidal in shape and accordingly the width (along the track width) of the magnetization free layer (free layer) will broaden.

This problem will be described below with reference to FIGS. 1a to 1e. If the cap layer 11a of the MR multi-layered structure 11 is thin, the width of the free layer 11b can be maintained narrow after the ion milling using a photoresist mask 10 to pattern the MR multi-layered structure 11 as shown in FIG. 1a. However, if the cap layer 11a' of the MR multi-layered structure 11' is thick, the width of the free layer 11b' is significantly broadened as shown in FIG. 1b. This is because the widths of the masks 10 and 10' are defined by the minimum line width determined by the physical limitation of lithography and cannot be reduced below the minimum line width. In other words, if the cap layer 11a' is thick as shown in FIG. 1c, the upper electrode layer can be planarized by adequate CMP and the hard bias layer for magnetic domain control 12' in the free layer can be made thick. Therefore a sufficient magnetic bias for magnetic domain control can be provided. However, the width of the free layer 11b' broadens.

In contrast, if the cap layer is thin, the width of the free layer 11b can be made narrow but a sufficient bias for magnetic domain control cannot be provided because the hard bias layer 12 for magnetic domain control in the free layer is thin. If the thickness of the hard bias layer 12 is increased as shown in FIG. 1d and CMP is omitted in order to provide a sufficient bias for magnetic domain control, the upper electrode layer cannot be planarized. If CMP is applied to a degree that can be performed on the thin cap layer in order to planarized the upper electrode layer, the hard bias layer 12" becomes thin as shown in FIG. 1e and therefore a sufficient bias for magnetic domain control cannot be provided.

In this way, there is a tradeoff among narrowing the width of the free layer, achieving a sufficient bias for magnetic domain control, and sufficiently planarizing the upper electrode layer.

SUMMARY OF THE INVENTION

It is therefore an object of the present invention to provide a method for manufacturing an MR element and a method for manufacturing a thin-film magnetic head that are capable of easily planarizing an upper electrode layer in an MR multi-layered structure without thickening a cap layer and capable of supplying a sufficient bias for magnetic domain control, and to provide a thin-film magnetic head manufactured using these methods.

According to the present invention, a manufacturing method of an MR element in which current flows in a direction perpendicular to layer planes, includes a step of forming on a lower electrode layer an MR multi-layered film having a cap layer at a top thereof, a step of forming a mask on the cap layer of the MR multi-layered film, a step of patterning the MR multi-layered film by milling through the mask to form an MR multi-layered structure, a step of forming a magnetic domain control bias layer by using a lift off method using the mask, a step of, after forming the magnetic domain control bias layer, forming an additional cap layer on the cap layer and a part of the magnetic domain control bias layer, a step of planarizing a top surface of the additional cap layer and the magnetic domain control bias layer, and a step of forming an upper electrode layer on the planarized top surface.

The MR multi-layered film having the cap layer at the top is patterned by milling through the mask to form the MR multi-layered structure and the mask is used to perform lift off to form the magnetic domain control bias layer for controlling the magnetic domain of the magnetization free layer. Then the additional cap layer is formed on the cap layer and a part of the magnetic domain control bias layer. The additional cap layer thus added on the cap layer of the MR multi-layered structure increases the effective thickness of the cap layer. Therefore subsequent planarization can be performed in a conventional manner. In addition, because the additional cap layer is formed after the milling of the MR multi-layered film, the problem that the width of the magnetization free layer is broadened can be avoided. Furthermore, because the thickness of the cap layer in effect is increased, a sufficiently thick magnetic domain control bias layer can be provided and, as a result, a sufficient magnetic domain control bias can be supplied to the magnetization free layer.

It is preferred that the step of forming a magnetic domain control bias layer includes forming a bias cap layer on the magnetic domain control bias layer by using a lift off method using the mask.

It is also preferred that the forming of a bias cap layer includes forming the bias cap layer so that a top surface of the bias cap layer is situated at a position higher than a top surface of the cap layer.

It is further preferred that the cap layer and the additional cap layer are made of the same material or different materials.

It is preferred that the cap layer and/or the additional cap layer is made of a nonmagnetic conductive material.

It is further preferred that the center in a thickness direction of the magnetic domain control bias layer is situated in the vicinity of a magnetization free layer of the MR multi-layered structure.

It is preferred that the step of planarizing a top surface of the additional cap layer and the magnetic domain control bias layer is performed by chemical-mechanical polishing.

It is also preferred that a TMR multi-layered film or a CPP-GMR multi-layered film is formed as the MR multi-layered film.

According to the present invention, also a method for manufacturing a thin-film magnetic head having a MR element in which current flows in a direction perpendicular to layer planes, includes a step of forming on a lower electrode layer a MR multi-layered film having a cap layer at a top thereof, a step of forming a mask on the cap layer of the MR multi-layered film, a step of patterning the MR multi-layered film by milling through the mask to form a MR multi-layered structure, a step of forming a magnetic domain control bias layer by using a lift off method using the mask, a step of, after forming the magnetic domain control bias layer, forming an additional cap layer on the cap layer and a part of the magnetic domain control bias layer, a step of planarizing a top surface of the additional cap layer and the magnetic domain control bias layer, and a step of forming an upper electrode layer on the planarized top surface.

According to the present invention, further, a thin-film magnetic head having a MR element in which current flows in a direction perpendicular to layer planes, includes a lower electrode layer, a MR multi-layered structure formed on the lower electrode layer and having a cap layer at a top thereof, a magnetic domain control bias layer magnetically joining to both side end surfaces of the MR multi-layered structure, an additional cap layer formed on the cap layer of the MR multi-layered structure and a part of the magnetic domain control bias layer, and an upper electrode layer formed on the additional cap layer and the magnetic domain control bias layer, a cross-section of the additional cap layer that is parallel to an air bearing surface having an inverted trapezoidal shape.

Because the additional cap layer is formed on the cap layer of the MR to increase the effective film thickness of the cap layer of the multi-layered structure, the width of the magnetization free layer does not increase because the cap layer itself remains thin. Furthermore, the profile of the additional cap layer that is parallel to ABS is inverted trapezoidal in shape. This means that the magnetic domain control bias layer is sufficiently thick. Therefore, a sufficient bias for magnetic domain control can be supplied to the magnetization free layer.

It is preferred that the thin-film magnetic head further includes a bias cap layer formed on the magnetic domain control bias layer.

It is also preferred that a top surface of the bias cap layer is situated at a position higher than a top surface of the cap layer.

It is further preferred that the cap layer and the additional cap layer are made of the same material or different materials.

It is also preferred that the cap layer and/or the additional cap layer is made of a nonmagnetic conductive material.

It is preferred that the center in a thickness direction of the magnetic domain control bias layer is situated in the vicinity of a magnetization free layer of the MR multi-layered structure.

It is further preferred that the MR multi-layered structure is a TMR multi-layered structure or a CPP-GMR multi-layered structure.

Further objects and advantages of the present invention will be apparent from the following description of the preferred embodiments of the invention as illustrated in the accompanying drawings.

BRIEF DESCRIPTION OF THE DRAWINGS

FIGS. 5a to 5n show cross-sectional views illustrating the manufacturing process shown in FIG. 4.

DESCRIPTION OF THE PREFERRED EMBODIMENTS

Figure 1A:
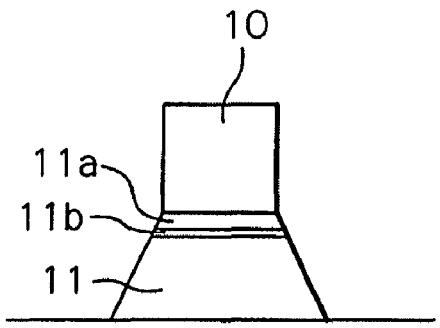
FIGS. 1a to 1e are views for illustrating problems in the conventional art.
Figure 1B:
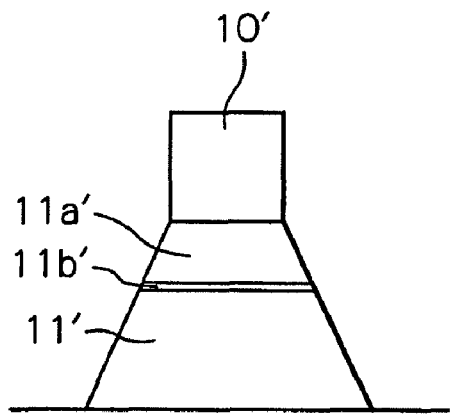
Figure 1C:
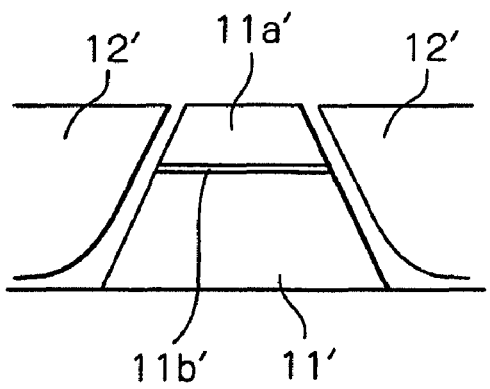
Figure 1D:
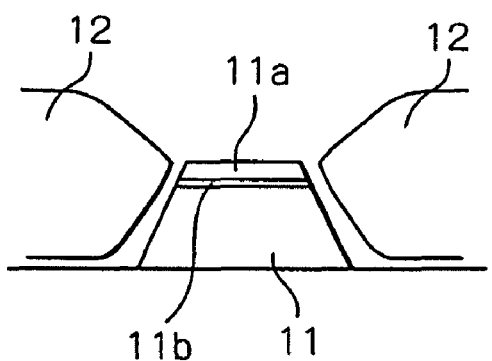
Figure 1E:
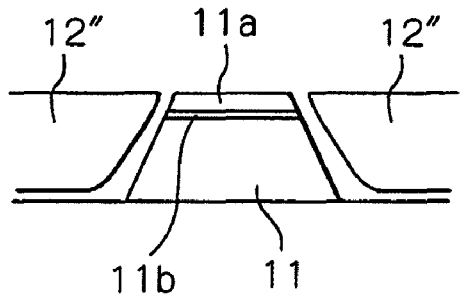
Figure 2:
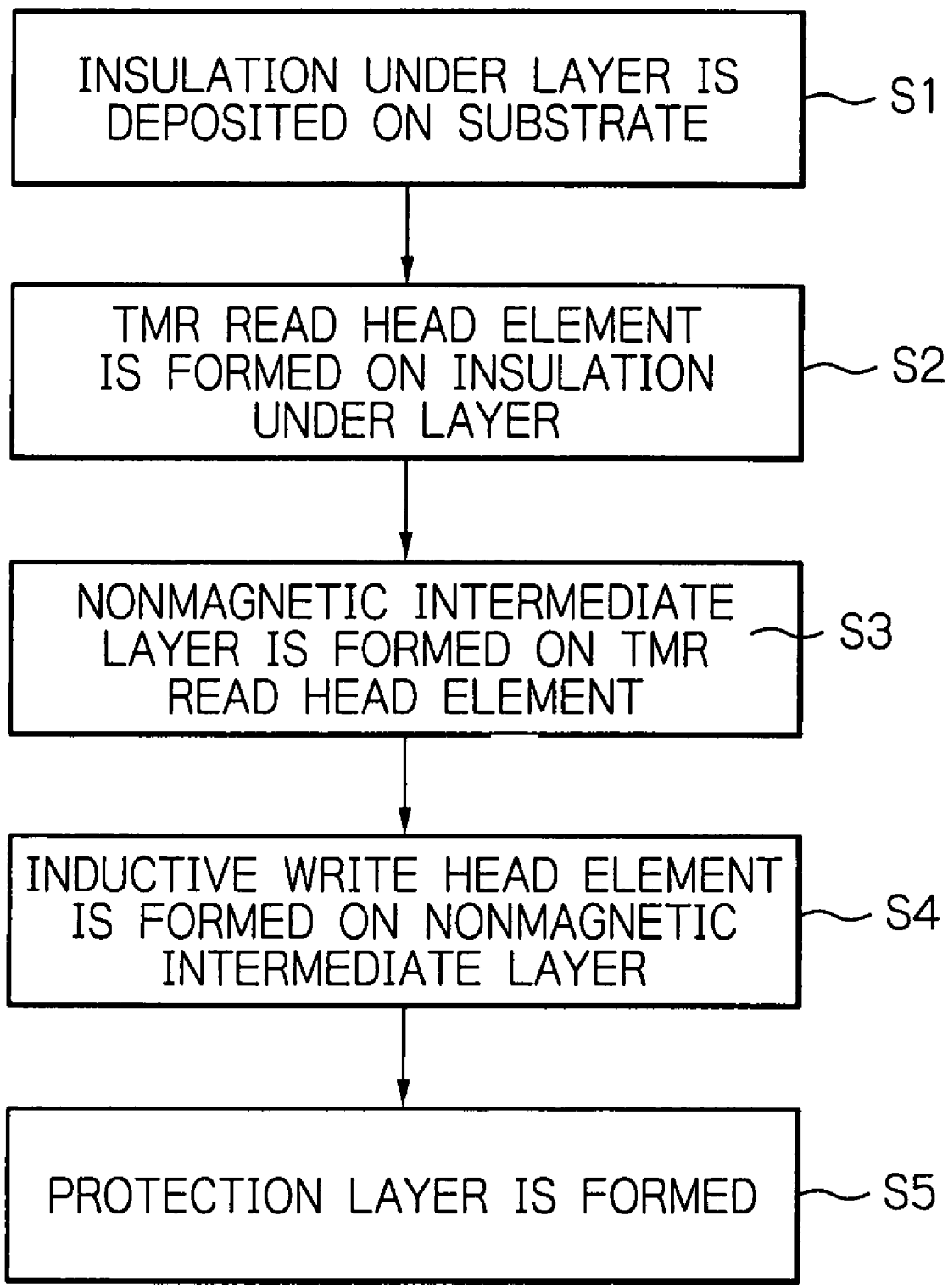
FIG. 2 is a flowchart illustrating a process for manufacturing a thin-film magnetic head according to an embodiment of the present invention.
Figure 3:
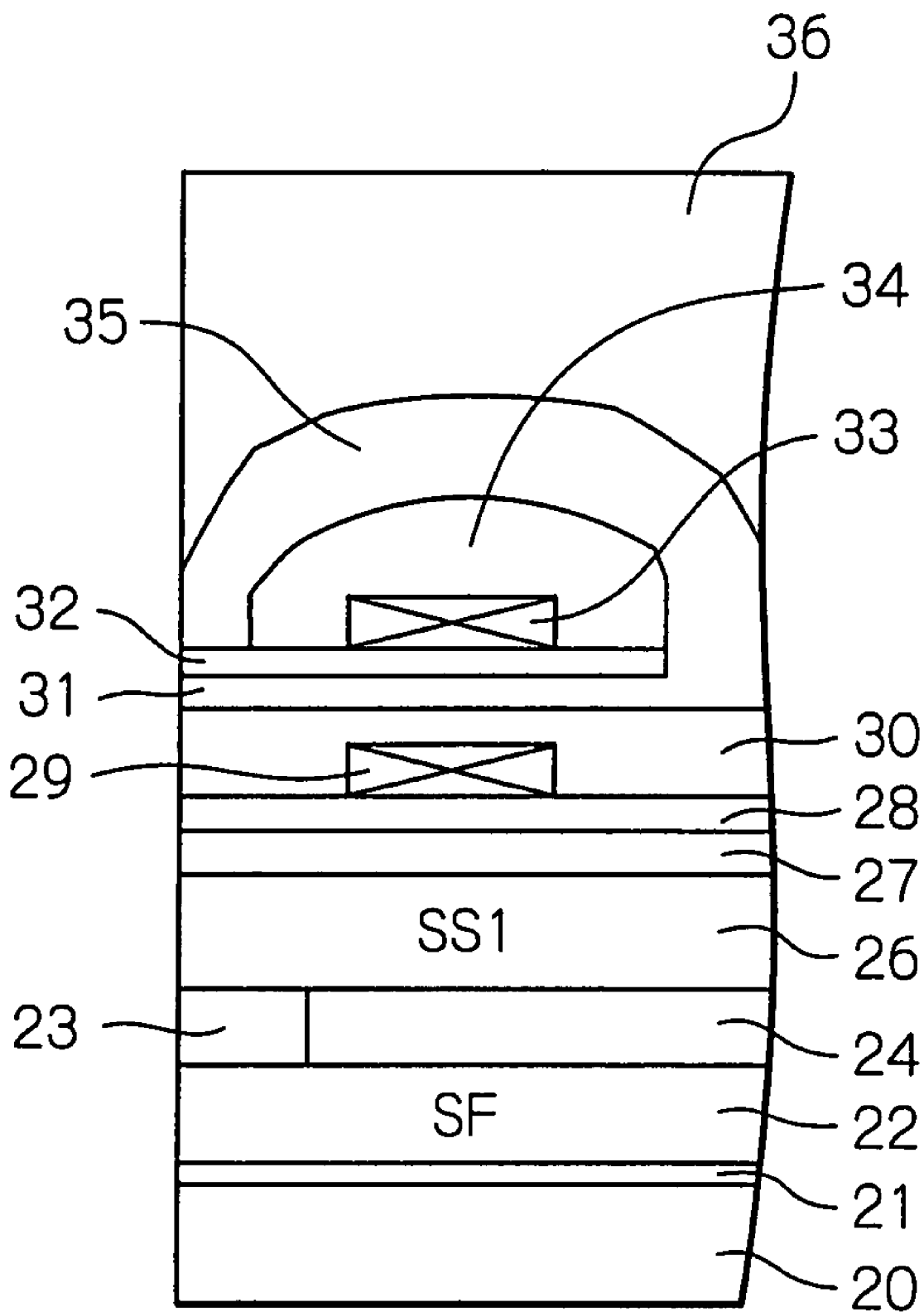
FIG. 3 is a cross-sectional view schematically illustrating a configuration of a thin-film magnetic head manufactured according to the embodiment shown in FIG. 2.
Figure 4:
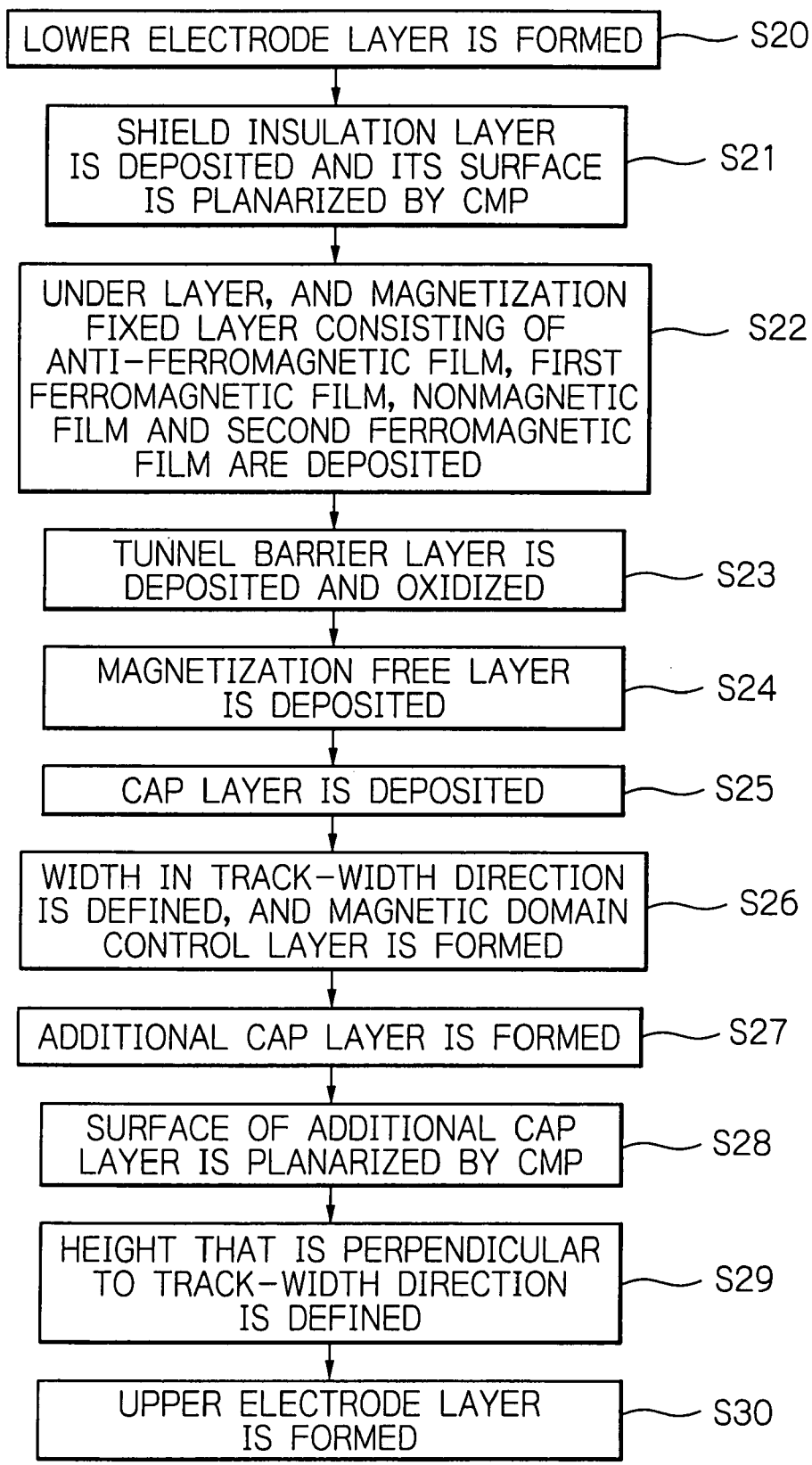
FIG. 4 is a flowchart illustrating in greater detail the step of manufacturing a read head element in the manufacturing process shown in FIG. 2.

FIG. 2 illustrates a process for manufacturing a thin-film magnetic head according to an embodiment of the present invention, FIG. 3 schematically illustrates a configuration of the thin-film magnetic head manufactured according to the embodiment shown in FIG. 2, FIG. 4 illustrates in further detail the step of manufacturing a read head element in the manufacturing process shown in FIG. 2, and FIGS. 5a to 5n illustrate the manufacturing process shown in FIG. 4. It should be noted that FIG. 3 shows a cross section of the thin-film magnetic head that is perpendicular to the ABS and track-width direction, and that FIGS. 5a, 5c, 5e, 5g, 5i, 5k and 5m show cross-sectional views taken along line I-I in FIGS. 5b, 5d, 5f, 5h, 5j, 5l and 5n, respectively.

While a TMR thin-film magnetic head is manufactured in this embodiment, a GMP thin-film magnetic head having a CPP structure can be manufactured by the basically same process except that a nonmagnetic conducting layer is formed instead of a tunnel barrier layer. The fundamental concept of this embodiment is also applicable to manufacturing of a GMR thin-film magnetic head having a CIP structure.

As shown in FIGS. 2 and 3, a substrate or wafer 20 made of a conductive material such as AlTic ($Al_2O_3$—TiC) is prepared first, and an insulation under layer 21 of an insulation material such as alumina ($Al_2O_3$) or silicon oxide ($SiO_2$) is deposited on the substrate 20 to have a thickness in the range from approximately 0.05 to 10 μm by a sputtering method for example (Step S1).

Then, a TMR read head element including a lower electrode layer 22 that also acts as a lower shield layer (SF), a TMR multi-layered structure 23, an insulation layer 24, a magnetic domain control bias layer 46 (see FIGS. 5e, 5g, 5i, 5k and 5m), and an upper electrode layer 26 that also acts as an upper shield layer (SS1) is formed on the insulation under layer 21 (Step S2). A process for manufacturing the TMR read head element will be described later in detail.

Then, a nonmagnetic intermediate layer 27 is formed on the TMR read head element (Step S3). The nonmagnetic intermediate layer 27 is a layer made of an insulation material such as $Al_2O_3$, $SiO_2$, aluminum nitride (AlN) or diamond-like carbon, or a metal material such as tantalum (Ta) or platinum (Pt) with a thickness in the range from approximately 0.1 to 0.5 μm and formed by for example a sputtering method or chemical vapor deposition (CVD) method. The nonmagnetic intermediate layer 27 separates the TMR read head element from an inductive write head element that will be formed on it.

Then, the inductive write head element including an insulation layer 28, a backing coil layer 29, a backing coil insulation layer 30, a main pole layer 31, an insulation gap layer 32, a write coil layer 33, a write coil insulation layer 34 and an auxiliary pole layer 35 is formed on the nonmagnetic intermediate layer 27 (Step S4). The inductive write head element in this embodiment has a perpendicular magnetic recording structure. However, it will be apparent that an inductive write head element having a horizontal or in-plane magnetic recording structure can be used. It will be also apparent that the perpendicular magnetic recording structure of the inductive write head element is not limited to the structure shown in FIG. 3 but instead any of various other structures can be used.

The insulation layer 28 is formed by depositing an insulation material such as $Al_2O_3$ or $SiO_2$ on the nonmagnetic intermediate layer 27 by using a sputtering method, for example. The upper surface of the insulating layer 28 is planarized by CMP, for example, as required. Formed on the insulation layer 28 is the baking coil layer 29 of a conductive material such as Cu by using such as a frame plating method to have a thickness in the range from approximately 1 to 5 μm. The purpose of the backing coil layer 29 is to guide a write magnetic flux so as to prevent adjacent track erasure (ATE). The backing coil insulation layer 30 is formed to have a thickness in the range from approximately 0.5 to 7 μm by photolithography a thermoset novolac resist so as to cover the backing coil layer 29.

The main magnetic pole layer 31 is formed on the backing coil insulation layer 30. The main magnetic pole layer 31 acts as a magnetic path for converging and guiding a magnetic flux induced by the write coil layer 33 to a perpendicular recording layer of a magnetic disk on which data is to be written. The main magnetic pole layer 31 is made of a metal magnetic material such as FeAlSi, NiFe, CoFe, NiFeCo, FeN, FeZrN, FeTaN, CoZrNb or CoZrTa, or a multi-layered film including these to have a thickness in the range from approximately 0.5 to 3 μm by such as a frame plating method.

The insulation gap layer 32 is formed on the main magnetic pole layer 31 by depositing an insulating film of a material such as $Al_2O_3$ or $SiO_2$ by using such as a sputtering method. Formed on the insulation gap layer 32 is the write coil insulation layer 34 of a thermoset novolac resist for example with a thickness in the range from approximately 0.5 to 7 μm. The write coil layer 33 of a conductive material such as Cu with a thickness of approximately 1 to 5 μm is formed inside the write coil insulation layer 34 by such as a frame plating method.

The auxiliary magnetic pole layer 35 of a metal magnetic material such as FeAlSi, NiFe, CoFe, NiFeCo, FeN, FeZrN, FeTaN, CoZrNb or CoZrTa, or a multi-layered film of any of these materials with a thickness of approximately 0.5 to 3 μm is formed by such as a frame plating method so as to cover the write coil insulation layer 34. The auxiliary magnetic pole layer 35 forms a return yoke.

Then, a protection layer 36 is formed on the inductive write head element (Step S5). The protection layer 36 may be formed by depositing a material such as $Al_2O_3$ or $SiO_2$ using a sputtering method.

This completes the wafer process for the thin-film magnetic head. The subsequent processes for manufacturing the thin-film magnetic head such as a machining process are well known and therefore the description of which will be omitted.

A process for manufacturing a TMR read head element will be described in detail with reference to FIGS. 4 and FIGS. 5a to 5n.

First, a lower electrode layer 22 that also acts as a lower shield layer is formed on the insulation under layer 21 (Step S20). The lower electrode layer 22 may be made of a metal magnetic material such as FeAlSi, NiFe, CoFe, FeNiCo, FeN, FeZrN, FeTaN, CoZrNb or CoZrTa by a frame plating method to have a thickness of approximately 0.1 to 3 μm. A shield insulation layer 40 is deposited on the lower electrode layer 22, and the top surface of the shield insulation layer 40 is planarized (Step S21). FIGS. 5a and 5b show the layers after planarization.

Then, a multi-layered under layer with a first under layer consisting of a material such as tantalum (Ta), hafnium (Hf), niobium (Nb), zirconium (Zr), titanium (Ti), molybdenum (Mo) or tungsten (W) with a thickness in the range from approximately 0.5 to 5 nm and a second under layer consisting of a material such as NiCr, NiFe, NiFeCr or Ru with a thickness in the range from approximately 1 to 5 nm, is formed by such as a sputtering method, on the lower electrode layer 22 and the shield insulating layer 40. Also, a magnetization fixed layer 41 is deposited on the multi-layered under layer (Step S22).

The magnetization fixed layer 41 in this embodiment is of synthetic type, formed by depositing in this order, using a sputtering method for example, an anti-ferromagnetic layer (pinning layer) of a material such as IrMn, PtMn, NiMn or RuRhMn with a thickness of approximately 5 to 15 nm, a first ferromagnetic layer of a material such as CoFe with a thickness of approximately 1 to 5 nm, a nonmagnetic layer of an alloy of one or more of materials such as ruthenium (Ru), rhodium (Rh), iridium (Ir), chromium (Cr), rhenium (Re) and copper (Cu) with a thickness of approximately 0.8 nm, and a second ferromagnetic layer having a two-layered structure consisting of a first ferromagnetic film of material such as CoFeB with a thickness of approximately 1 to 3 nm and a second ferromagnetic film of a material such as CoFe with a thickness of approximately 0.2 to 3 nm.

Then, a tunnel barrier layer 42 of an aluminum (Al), titanium (Ti), Ta, Zr, Hf, magnesium (Mg), silicon (Si) or zinc (Zn) with a thickness of approximately 0.3 to 1 nm is deposited on the magnetization fixed layer 41 by such as a sputtering method, and then oxidized (Step S23).

A magnetization free layer (free layer) 43 is formed on the oxidized barrier layer 42 by depositing a high-polarizability film of a material CoFe with a thickness of approximately 1 nm and a soft magnetic film of a material such as NiFe with a thickness of approximately 2 to 6 nm in this order by a sputtering method (Step S24).

Then, a relatively thin cap layer 44 consisting of one or more layers of a nonmagnetic conductive material such as Ta, Ru, Hf, Nb, Zr, Ti, Cr or W with a thickness of approximately 1 to 20 nm is deposited by such as a sputtering method (Step S25). FIGS. 5c and 5d show the TMR multi-layered film formed as a result of the steps described thus.

Then, the width in the track width direction of the TMR multi-layered film thus formed is defined or adjusted, and a magnetic domain control layer is formed (Step S26). Namely, at this step S26, first, a resist having a resist pattern used for lift off is formed on the multi-layered film, then ion beam etching with Ar ions for example using the resist as a mask to the TMR multi-layered film is performed so as to pattern it, and an insulation layer 45 of an insulation material such as $Al_2O_3$ or $SiO_2$ with a thickness of approximately 3 to 20 nm is deposited. Next, on the insulating layer 45, an under layer of a material such as Ta, Ru, Hf, Nb, Zr, Ti, Mo, Cr or W, a hard bias layer 46 of a material such as CoFe, NiFe, CoPt, or CoCrPt, and a bias cap layer 47 are sequentially deposited in this order by such as a sputtering method. Then, the resist is removed by lift off to form the hard bias layer 46 and the bias cap layer 47. FIGS. 5e and 5f show this state. As can be seen from the figures, the cap layer 44 of the TMR multi-layered structure is recessed lower than the hard bias layer 46 and the bias cap layer 47. That is, the top surface of the bias cap layer 47 is at a position higher than the top surface of the cap layer 44. In addition, according to this embodiment, as it is possible to make the cap layer 44 thin because an additional cap layer 48 is formed on it as will be described later, the center in the thickness direction, of the hard bias layer 46 formed by the lift off using the same resist mask that was used for milling of the TMR multi-layered structure can be situated close to the free layer 43.

Then, an additional cap layer 48 is formed (Step S27). Namely, at this step S27, first, a resist having a pattern for lift of is formed, a layer of a nonmagnetic conductive material such as Ta, Ru, Hf, Nb, Zr, Ti, Cr or W is deposited by such as a sputtering method using the resist as a mask, and then the resist is removed by lift off to form the additional cap layer 48. FIGS. 5g and 5h show this state. As can be seen from the figures, the additional cap layer 48 is formed to fill at least the recess above the cap layer 44 of the TMR multi-layered structure. That is, the additional cap layer 48 is formed on the cap layer 44 and on the bias cap layer 47 in the vicinity of the cap layer 44. The additional cap layer 48 and the cap layer 44 may be made of the same nonmagnetic conductive material or of different nonmagnetic conductive materials.

The additional cap layer 48 is then polished by such as a CMP method to planarize the top surface of the additional cap layer 48 and the top surface of the bias cap layer 47 (Step S28). Preferably, the polishing is controlled so that the end point of the polishing is at the top surface of the bias cap layer 47. FIGS. 5i and 5j show this state.

Then, the height of the TMR multi-layered structure in a direction perpendicular to the track-width direction is defined or adjusted (Step S29). Namely, at this step S29, first, a resist having a resist pattern used for lift off is formed, and ion beam etching with Ar ions to the TMR multi-layered film is performed using the resist as a mask so as to pattern it. Then, an insulating layer 49 of an insulation material such as $Al_2O_3$ or $SiO_2$ is deposited by such as a sputtering method and the resist is removed by lift off. Thus, the final TMR multi-layered structure 23 and hard bias layer 46 are formed. FIGS. 5k and 5l show this state. As can be seen from the figures, the additional cap layer 48 fills the recess above the cap layer 44 of the TMR multi-layered structure 23, and therefore the additional cap layer 48 has an inverted trapezoidal shape in the cross-section parallel to ABS.

The layer structure, material and thickness of each of the magnetization fixed layer, barrier layer and the magnetization free layer that constitute the magneto-sensitive portion of the TMR multi-layered structure 23 are not limited to that described above, but various materials and thicknesses may be optionally adopted. For example, the magnetization fixed layer is not limited to the three-layered films plus the anti-ferromagnetic film, but may be formed from a single-layer film made of a ferromagnetic film plus the anti-ferromagnetic film, or multi-layered films other than three films, plus the anti-ferromagnetic film. The magnetization free layer is not limited to the two-layered films, but may be formed from a single-layer film other than the high-polarizability film or multi-layered films of more than two films with a magneto-striction control film. Furthermore, the magnetization fixed layer, barrier layer and magnetization free layer of the magneto-sensitive portion may be formed in the inverse order, that is, in the order of the magnetization free layer, the barrier layer and the magnetization fixed layer from the bottom. In that case, the anti-ferromagnetic film in the magnetization fixed layer will be positioned at the top.

Then, an upper electrode layer 26, which also acts as an upper shied layer (SS1), of a metal magnetic material such as FeAlSi, NiFe, CoFe, NiFeCo, FeN, FeZrN, FeTaN, CoZrNb or CoZrTa, or of a multi-layered film of any of these materials with a thickness of approximately 0.5 to 3 µm is formed on the insulating layer 49 and the TMR multi-layered structure 23 by such as a frame plating method (Step S30). FIGS. 5m and 5n show this state. As a result of the process described above, the TMR read head element is formed.

As has been described above, according to this embodiment, the TMR multi-layered film having the cap layer 44 is patterned by milling through the mask to form a TMR multi-layered structure 23, the magnetic domain control hard bias layer 46 and the bias cap layer 47 is formed by lift off using the mask, and then the additional cap layer 48 is formed on the cap layer 44 and a part of the bias cap layer 47. Thus, the additional cap layer 48 is formed on the cap layer 44 of the MR multi-layered structure 23, thereby to increase the effective thickness of the cap layer. As a result, the subsequent planarization can be performed in a conventional manner. Also, because the additional cap layer 44 is formed in a process step after milling of the MR multi-layered film, the problem that the width (track width) of the free layer 43 is broadened can be avoided. In addition, because the effective thickness of the cap layer is increased, the sufficiently thick hard bias layer 46 can be formed and accordingly a sufficient bias for magnetic domain control can be supplied to the free layer 43.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A manufacturing method of a magnetoresistive effect element in which current flows in a direction perpendicular to layer planes, comprising the steps of:
forming on a lower electrode layer a magnetoresistive effect multi-layered film having a cap layer at a top thereof;
forming a mask on said cap layer of said magnetoresistive effect multi-layered film;

patterning said magnetoresistive effect multi-layered film by milling through said mask to form a magnetoresistive effect multi-layered structure;

forming a magnetic domain control bias layer by using a lift off method using said mask;

after forming said magnetic domain control bias layer, forming an additional cap layer on said cap layer and a part of said magnetic domain control bias layer;

planarizing a top surface of said additional cap layer and said magnetic domain control bias layer; and forming an upper electrode layer on the planarized top surface.

2. The manufacturing method as claimed in claim 1, wherein the step of forming a magnetic domain control bias layer comprises forming a bias cap layer on said magnetic domain control bias layer by using a lift off method using said mask.

3. The manufacturing method as claimed in claim 2, wherein the forming of a bias cap layer comprises forming said bias cap layer so that a top surface of said bias cap layer is situated at a position higher than a top surface of said cap layer.

4. The manufacturing method as claimed in claim 1, wherein said cap layer and said additional cap layer are made of the same material.

5. The manufacturing method as claimed in claim 1, wherein said cap layer and said additional cap layer are made of different materials.

6. The manufacturing method as claimed in claim 1, wherein said cap layer and said additional cap layer are made of one of a same nonmagnetic conductive material and different nonmagnetic conductive material.

7. The manufacturing method as claimed in claim 1, wherein a center in a thickness direction of said magnetic domain control bias layer is situated in the vicinity of a magnetization free layer of said magnetoresistive effect multi-layered structure.

8. The manufacturing method as claimed in claim 1, wherein the step of planarizing a top surface of said additional cap layer and said magnetic domain control bias layer is performed by chemical-mechanical polishing.

9. The manufacturing method as claimed in claim 1, wherein a tunnel magnetoresistive effect multi-layered film or a current-perpendicular-to-plane giant magnetoresistive effect multi-layered film is formed as said magnetoresistive effect multi-layered film.

10. A method for manufacturing a thin-film magnetic head having a magnetoresistive effect element in which current flows in a direction perpendicular to layer planes, comprising the steps of:

forming on a lower electrode layer a magnetoresistive effect multi-layered film having a cap layer at a top thereof;

forming a mask on said cap layer of said magnetoresistive effect multi-layered film;

patterning said magnetoresistive effect multi-layered film by milling through said mask to form a magnetoresistive effect multi-layered structure;

forming a magnetic domain control bias layer by using a lift off method using said mask;

after forming said magnetic domain control bias layer, forming an additional cap layer on said cap layer and a part of said magnetic domain control bias layer;

planarizing a top surface of said additional cap layer and said magnetic domain control bias layer; and forming an upper electrode layer on the planarized top surface.

* * * * *